United States Patent
Cheng

(10) Patent No.: US 12,293,718 B2
(45) Date of Patent: May 6, 2025

(54) PIXEL DRIVE CIRCUIT CONFIGURED TO TRANSMIT VOLTAGE SIGNAL TO NODES AFTER DATA WRITE STAGE, AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Weigao Cheng, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/523,765

(22) Filed: Nov. 29, 2023

(65) Prior Publication Data

US 2024/0331629 A1 Oct. 3, 2024

(30) Foreign Application Priority Data

Mar. 30, 2023 (CN) .......................... 202310350464.4

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0852* (2013.01); *G09G 2300/0861* (2013.01); *G09G 2310/08* (2013.01)

(58) Field of Classification Search
None
See application file for complete search history.

(56) References Cited

U.S. PATENT DOCUMENTS

| 2020/0126478 | A1* | 4/2020 | Lee | ..................... G09G 3/325 |
| 2022/0173189 | A1* | 6/2022 | Kim | ................... H10K 59/1213 |
| 2024/0078971 | A1* | 3/2024 | Han | ..................... H01L 27/124 |
| 2024/0290259 | A1* | 8/2024 | Guo | ..................... G09G 3/3266 |

FOREIGN PATENT DOCUMENTS

CN 113674690 A * 11/2021

* cited by examiner

*Primary Examiner* — Kirk W Hermann
(74) *Attorney, Agent, or Firm* — PV IP PC; Wei Te Chung

(57) ABSTRACT

A pixel drive circuit includes a light-emitting device electrically connected to a first power supply terminal and a second power supply terminal; a drive transistor having a gate electrically connected to a first node and a source and a drain electrically connected to second and third nodes; a first light-emitting control transistor having a source and a drain electrically connected to the first power supply terminal and the second node, and a gate configured to receive a first light-emitting control signal; and a second light-emitting control transistor having a source and a drain electrically connected to the third node and the light-emitting device, and a gate configured to receive a second light-emitting control signal. The first light-emitting control transistor is configured to transmit a first voltage signal supplied from the first power supply terminal to the second and third nodes at a node setting stage.

16 Claims, 10 Drawing Sheets

PIXEL DRIVE CIRCUIT CONFIGURED TO TRANSMIT VOLTAGE SIGNAL TO NODES AFTER DATA WRITE STAGE, AND DISPLAY PANEL

CROSS-REFERENCE TO RELATED APPLICATION

This application claims the benefit of priority to Chinese Patent Application No. 202310350464.4 filed on Mar. 30, 2023, the content of which is incorporated herein by reference in its entirety.

TECHNICAL FIELD

The present disclosure relates to a display technology field, and in particular, to pixel drive circuit and a display panel.

BACKGROUND

In the conventional display panel, a plurality of sub-pixels are respectively driven by a plurality of pixel drive circuits for display of the display panel. However, when the pixel drive circuit drives the light-emitting device to emit light, source electrodes and drain electrodes of respective drive transistors also have different potentials corresponding to different display gray scales, thereby causing different gate potential transitions of respective drive transistors and affecting the display quality.

SUMMARY

In view of above, the present disclosure provides a pixel drive circuit and a display panel, which may improve the display quality of the display panel.

According to a first aspect, the present disclosure provides a pixel drive circuit, including: a light-emitting device between and electrically connected to a first power supply terminal and a second power supply terminal; a drive transistor having a gate electrically connected to a first node and a source and a drain between and electrically connected to a second node and a third node, where the drive transistor is configured to generate a driving current to drive the light-emitting device during a light-emitting stage to emit light in response to a data signal written in a data write stage; a first light-emitting control transistor having a source and a drain between and electrically connected to the first power supply terminal and the second node, and a gate configured to receive a first light-emitting control signal; and a second light-emitting control transistor having a source and a drain between and electrically connected to the third node and the light-emitting device, and a gate configured to receive a second light-emitting control signal, where the first light-emitting control transistor is configured to transmit a first voltage signal supplied from the first power supply terminal to the second node and the third node at a node setting stage after the data write stage and before the light-emitting stage.

According to a second aspect, the present disclosure provides a display panel, including: a plurality of sub-pixels each includes the pixel drive circuit above, a plurality of first light-emitting control lines configured to transmit a plurality of the first light-emitting control signals; and a plurality of second light-emitting control lines configured to transmit a plurality of the second light-emitting control signals; where the first light-emitting control transistor of each of the pixel drive circuits includes a first active layer including a first channel portion, the second light-emitting control transistor of each of the pixel drive circuits includes a second active layer including a second channel portion, the drive transistor of each of the pixel drive circuits include a third active layer; each of the first light-emitting control lines is located between the third active layers of a portion of the plurality of sub-pixels in a same row and a second light-emitting control line; the first active layer and the second active layer of each of the pixel drive circuits are located at a same side of the third active layer, and the first channel portion at least partially overlaps a corresponding one of the first light-emitting control lines, and the second channel portion at least partially overlaps a corresponding one of the second light-emitting control lines.

BRIEF DESCRIPTION OF THE DRAWINGS

In order to more clearly illustrate technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

DETAILED DESCRIPTION

Technical solutions in embodiments of the present disclosure will be clearly and completely described below in conjunction with accompanying drawings in the embodiments of the present disclosure. It will be apparent that the embodiments described below are merely part of, but not all of, the embodiments of the present disclosure. According to the embodiments of the present disclosure, all other embodiments obtained by those skilled in the art without creative work fall within the protection scope of the present disclosure. In addition, it should be understood that specific implementations described herein are merely intended to illustrate and explain the present disclosure and are not used to limit the present disclosure. In the present disclosure, unless otherwise stated, directional words used such as "upper" and "lower" generally refer to upper and lower directions of the device in actual use or working state, and specifically refer to drawing directions in the accompanying drawings. "inner" and "outer" are provided with respect to the outline of the device.

Figure 1:
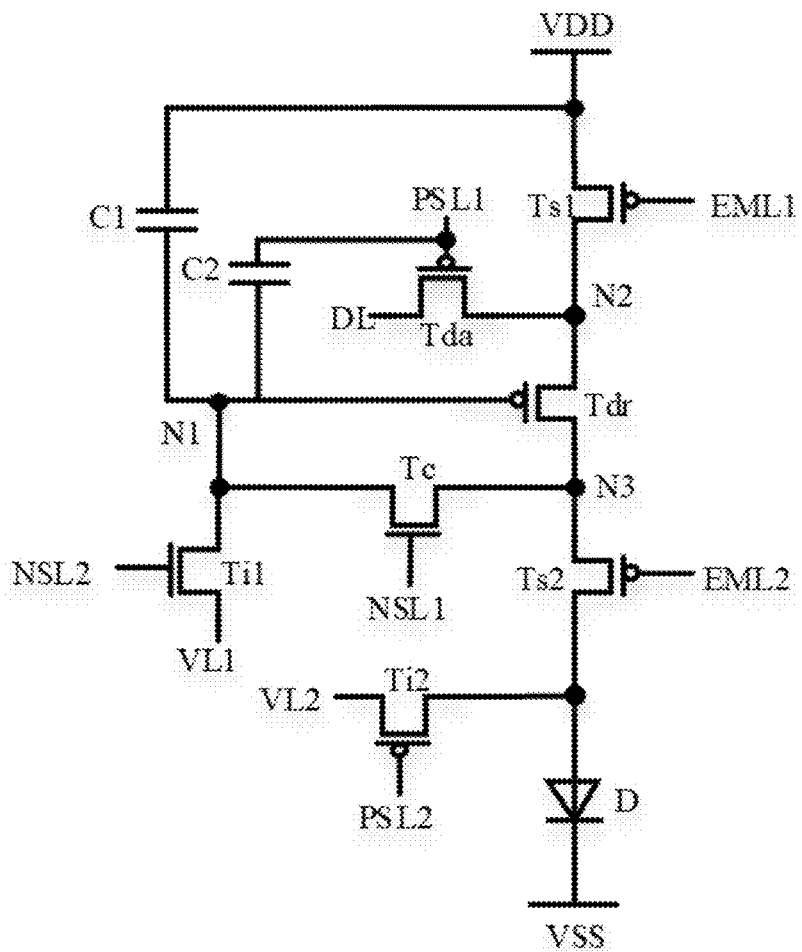
FIG. 1 is a schematic block view of a pixel drive circuit according to an embodiment of the present disclosure.

FIG. 1 is a schematic block diagram of a pixel drive circuit according to an embodiment of the present disclosure. An embodiment of the present disclosure provides a pixel drive circuit including a light-emitting device D, a drive transistor Tdr, a first light-emitting control transistor Ts1, and a second light-emitting control transistor Ts2.

The light-emitting device D is between and electrically connected to a first power supply terminal VDD and a second power supply terminal VSS. Alternatively, the light-emitting device D includes an organic light-emitting diode, a sub-millimeter light-emitting diode, a micro light-emitting diode, or the like.

A gate of the drive transistor Tdr is electrically connected to a first node N1, a source and a drain of the drive transistor Tdr are between and electrically connected to a second node N2 and a third node N3, and the drive transistor Tdr is configured to generate a drive current according to a data signal written in a data writing stage twd in a light-emitting stage tem to drive the light-emitting device D to emit light.

A source and a drain of the first light-emitting control transistor Ts1 are between and electrically connected to the first power supply terminal VDD and the second node N2, and a gate of the first light-emitting control transistor Ts1 is configured to receive a first light-emitting control signal EM1. Alternatively, the gate of the first light-emitting control transistor Ts1 is electrically connected to a first light-emitting control line EML1, which is configured to transmit the first light-emitting control signal EM1.

A source and a drain of the second light-emitting control transistor Ts2 are between and electrically connected to the third node N3 and the light-emitting device D. A gate of the second light-emitting control transistor Ts2 is configured to receive a second light-emitting control signal EM2. Alternatively, the gate of the second light-emitting control transistor Ts2 is electrically connected to a second light-emitting control line EML2, which is configured to transmit the second light-emitting control signal EM2. The first light-emitting control signal EM1 and the second light-emitting control signal EM2 are different.

Alternatively, the pixel drive circuit further includes a data transistor Tda, a compensation transistor Tc, a first reset transistor Ti1, and a second reset transistor Ti2.

One of a source and a drain of the data transistor Tda is electrically connected to the second node N2, the other of the source and the drain of the data transistor Tda is configured to receive a data signal, and a gate of the data transistor Tda is configured to receive a first scan signal PScan1. Alternatively, the other of the source and the drain of the data transistor Tda is electrically connected to a data line DL configured to transmit the data signal. The gate of the data transistor Tda is electrically connected to a first scan line PSL1, which is configured to transmit the first scan signal PScan1.

A source and a drain of the compensation transistor Tc are between and electrically connected to the first node N1 and the third node N3, and a gate of the compensation transistor Tc is configured to receive the second scan signal NScan1. Alternatively, the gate of the compensation transistor Tc is electrically connected to a second scan line NSL1, which is configured to transmit the second scan signal NScan1. The second scan signal NScan1 and the first scan signal PScan1 are different.

Alternatively, the compensation transistor Tc includes a metal oxide thin film transistor. The metal oxide thin film transistor includes indium gallium zinc oxide, or the like.

One of a source and a drain of the first reset transistor Ti1 is electrically connected to the first node N1, the other of the source and the drain of the first reset transistor Ti1 is configured to receive a first reset signal, and a gate of the first reset transistor Ti1 is configured to receive a third scan signal NScan2. Alternatively, the other of the source and the drain of the first reset transistor Ti1 is electrically connected to a first reset line VL1 configured to transmit the first reset signal. The gate of the first reset transistor Ti1 is electrically connected to a third scan line NSL2, which is configured to transmit the third scan signal NScan2. The third scan signal NScan2 is different from the first scan signal PScan1 and the second scan signal NScan1.

Alternatively, the first reset transistor Ti1 includes a metal oxide thin film transistor. The metal oxide thin film transistor includes indium gallium zinc oxide, or the like.

One of a source and a drain of the second reset transistor Ti2 is electrically connected to the light-emitting device D. The other of the source and the drain of the second reset transistor Ti2 is configured to receive a second reset signal, and a gate of the second reset transistor Ti2 is configured to receive a fourth scan signal PScan2. Alternatively, the other of the source and the drain of the second reset transistor Ti2 is electrically connected to a second reset line VL2 configured to transmit the second reset signal. The gate of the second reset transistor Ti2 is electrically connected to a fourth scan line PSL2, which is configured to transmit the fourth scan signal PScan2. The fourth scan signal PScan2 is different from the third scan signal NScan2 and the second scan signal NScan1. The fourth scan signal PScan2 is the same as or different from the first scan signal PScan1.

Alternatively, the data transistor Tda and the compensation transistor Tc are configured to transmit a data signal to the first node N1 in the data write stage twd.

Alternatively, the pixel drive circuit further includes a first capacitor C1 connected in series between the first power supply terminal VDD and the first node N1.

Alternatively, the pixel drive circuit further includes a second capacitor C2 connected in series between the gate of the data transistor Tda and the first node N1.

FIGS. 2A-2E are timing diagrams according to embodiments of the present disclosure. In the related art, when the first light-emitting control transistor Ts1 and the second light-emitting control transistor Ts2 are turned on in accordance with the light-emitting control signal transmitted in the light-emitting control line, the second node N2 and the third node N3 have different potentials at different display gray scales. As a result, a gate-source voltage Vgs of the drive transistor Tdr at different display gray scales corresponds to different gate-source capacitances Cgs. When the first light-emitting control transistor Ts1 is turned on, the first voltage signal supplied from the first power supply terminal VDD is transmitted to the second node N2, and the first capacitor C1 maintains the potential of the first node N1, so that the gate-source voltage Vgs of the drive transistor Tdr is unchanged. When the second light-emitting control transistor Ts2 is turned on, the potential of the third node N3 is floating because the second light-emitting control transistor Ts2 is turned on, which causes the gate-source voltage of the drive transistor Tdr to be affected, so that the gate-source voltage Vgs of the drive transistor Tdr become no longer unchanged. Therefore, the capacitances on the light-emitting control line are different when the light-emitting control signal for controlling the turn-on of the first light-emitting control transistor Ts1 and the second light-emitting control transistor Ts2 is active, thereby causing the potential jump of the first node N1 to be different, and then causing a display problem (e.g., crosstalk problem) on the display panel to which the pixel drive circuit is applied.

In the related art, the second node N2 and the third node N3 have different potentials at different display grayscales, the jumps in the gate potential of the drive transistor are different, and the display quality is degraded. The first light-emitting control transistor Ts1 is configured to transmit the first voltage signal supplied from the first power supply terminal VDD to the second node N2 and the third node N3 in the node setting stage tsn after the data write stage twd and before the light-emitting stage tem. In the light-emitting stage tem, the first light-emitting control transistor Ts1 is turned on in accordance with the first light-emitting control signal EM1, the second light-emitting control transistor Ts2 is turned on in accordance with the second light-emitting control signal EM2, and the drive transistor Tdr generates a drive current in accordance with the data signal to drive the light-emitting device D to emit light.

The first voltage signal is transmitted to the second node N2 and the third node N3 by turn-on of the first light-emitting control transistor Ts1 in the node setting stage tsn, so that the potential of the second node N2 and the potential of the third node N3 are maintained at a voltage value corresponding to the first voltage signal, so that when the second light-emitting control transistor Ts2 is turned on at the light-emitting stage tem, the gate-source voltages Vgs of the drive transistor Tdr corresponding to the different display gray scales have at a same value, thereby improving the difference between the gate-source capacitance Cgs of the drive transistor Tdr, and improving the crosstalk problem.

Figure 2A:
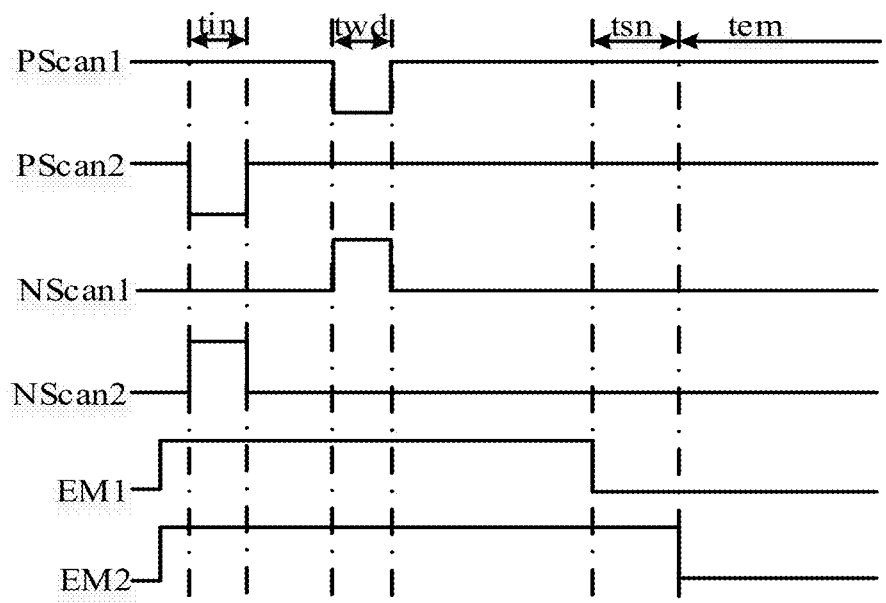
FIGS. 2A-2E are timing diagrams of a pixel drive circuit according to an embodiment of the present disclosure.

Referring to FIGS. 1 and 2A, the operation principle of the pixel drive circuit will be described with reference to an example in which the drive transistor Tdr, the first light-emitting control transistor Ts1, the second light-emitting control transistor Ts2, the data transistor Tda, and the second reset transistor Ti2 are P-type transistors, and the first reset transistor Ti1 and the compensation transistor Tc are N-type transistors.

In the reset stage tin, the first scan signal PScan1, the third scan signal NScan2, the first light-emitting control signal EM1, and the second light-emitting control signal EM2 all have high levels, the second scan signal NScan1 has a low level, the first reset transistor Ti1 is turned on, and the first reset signal is transmitted to the first node N1 to reset the potential of the first node N1.

In the data write stage twd, the second scan signal NScan1, the first light-emitting control signal EM1 and the second light-emitting control signal EM2 all have high levels, and the first scan signal PScan1 and the third scan signal NScan2 both have low levels. The data transistor Tda and the compensation transistor Tc are turned on, and the data signal is transmitted to the first node N1.

Alternatively, the fourth scan signal PScan2 may have a low level at the reset stage tin and/or the data write stage twd, so that the second reset transistor Ti2 is turned on, the second reset signal is transmitted to an anode of the light-emitting device D, and an anode potential of the light-emitting device D is reset.

In the node setting stage tsn, the first scan signal PScan1, the fourth scan signal PScan2, and the second light-emitting control signal EM2 all have high levels, the first light-emitting control signal EM1, the second scan signal NScan1, and the third scan signal NScan2 all have low levels, and the first light-emitting control transistor Ts1 is turned on. Since the drive transistor Tdr is at the turn-on state after the data signal is transmitted to the first node N1, the first voltage signal supplied from the first voltage terminal may be transmitted to the second node N2 and the third node N3.

In the light-emitting stage tem, the first scan signal PScan1 and the fourth scan signal PScan2 all have high levels, and the first light-emitting control signal EM1, the second light-emitting control signal EM2, the second scan signal NScan1 and the third scan signal NScan2 all have low levels. The first light-emitting control transistor Ts1 and the second light-emitting control transistor Ts2 are turned on, and the drive transistor Tdr generates a drive current to drive the light-emitting device D.

Figure 2B:
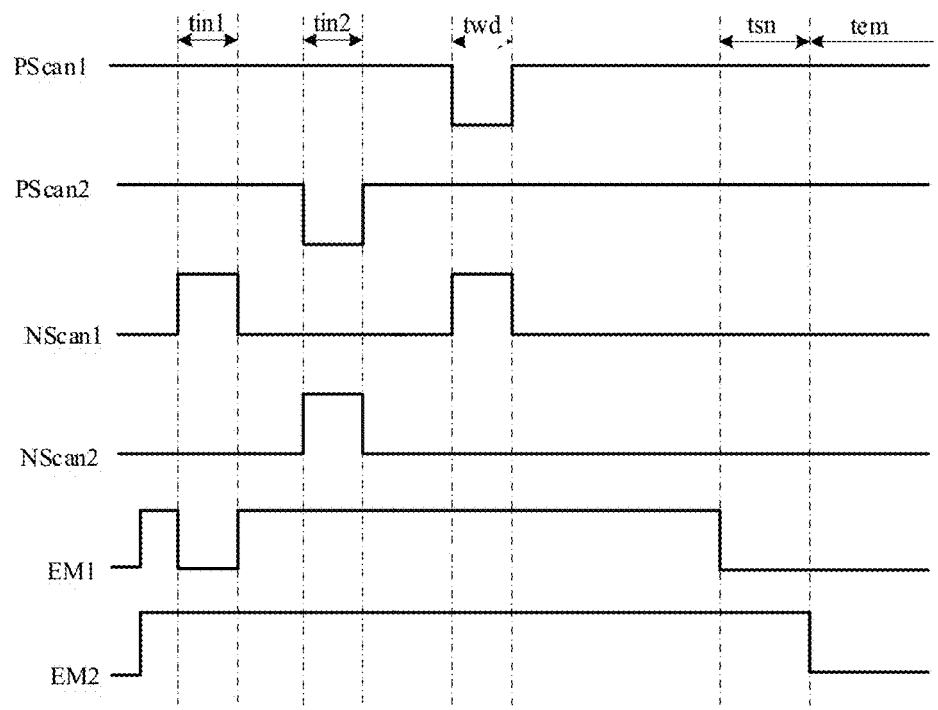

Alternatively, referring to FIGS. 1 and 2B, when the first reset transistor Ti1 is turned on, the first node N1 has different potentials at different display gray scales, so that the reset effects of the first node N1 are different. In addition, the potentials of the second node N2 and the third node N3 corresponding to different display gray scales are different, so that the potentials of the second node N2 and the third node N3 have different starting points when the first node N1 is reset. Therefore, the potentials of the second node N2 and the third node N3 corresponding to different display gray scales are different when the first node N1 is reset, so that the gate-source voltage Vgs of the drive transistor Tdr is different from the gate-drain voltage Vgd, there is a flicker difference between a picture at the high display gray scale and a picture at the low display gray scale, and there is a flicker problem in the display panel including the pixel drive circuit.

In the present disclosure, in order to improve the flicker problem caused by the flicker difference between pictures at different display gray levels, the compensation transistor Tc and the first light-emitting control transistor Ts1 are configured to transmit the first voltage signal to the first node N1, the second node N2, and the third node N3 at the first reset stage tin1 before the data write stage twd. In the second reset stage tin2 after the first reset stage tin1 and before the data write stage twd, the first reset transistor Ti1 is configured to transmit the first reset signal to the first node N1.

The compensation transistor Tc and the first light-emitting control transistor Ts1 are turned on in the first reset stage tin1, so that the first voltage signal is transmitted to the first node N1, the second node N2 and the third node N3, it is possible to make the potentials of the first node N1 in the first reset stage tin1 corresponding to the different display gray scales have the same initial potential, and to make each of the gate-source voltage Vgs and the gate-drain voltage Vgd of the drive transistor Tdr have an unchanged value in the second reset stage tin2, so as to improve the flicker problem caused by the flicker difference under the different display gray scales.

Further, with reference to FIGS. 1 and 2B, the operation of the pixel drive circuit will be described.

In the reset stage tin1, the first scan signal PScan1, the second scan signal NScan1, and the second light-emitting control signal EM2 all have high levels, and the third scan signal NScan2 and the first light-emitting control signal EM1 both have low levels, the compensation transistor Tc and the first light-emitting control transistor Ts1 are turned on, and the first voltage signal is transmitted to the first node N1, the second node N2, and the third node N3.

In the reset stage tin2, the first scan signal PScan1, the third scan signal NScan2, the first light-emitting control signal EM1, and the second light-emitting control signal EM2 all have high levels, the second scan signal NScan1 has a low level, the first reset transistor Ti1 is turned on, and the first reset signal is transmitted to the first node N1 to reset the potential of the first node N1 again.

Herein, the operation principle of the pixel drive circuit in the data write stage twd, the node setting stage tsn, and the light-emitting stage tem in FIG. 2B may be obtained with reference to the operation principle of the pixel drive circuit in the data write stage twd, the node setting stage tsn, and the light-emitting stage tem in FIG. 2A, and details are not described herein.

Alternatively, the fourth scan signal PScan2 may have a low level in at least one of the first reset stage tin1, the second reset stage tin2, and the data write stage twd, so that the second reset transistor Ti2 is turned on, the second reset signal is transmitted to an anode of the light-emitting device D, and an anode potential of the light-emitting device D is reset.

Figure 2C:
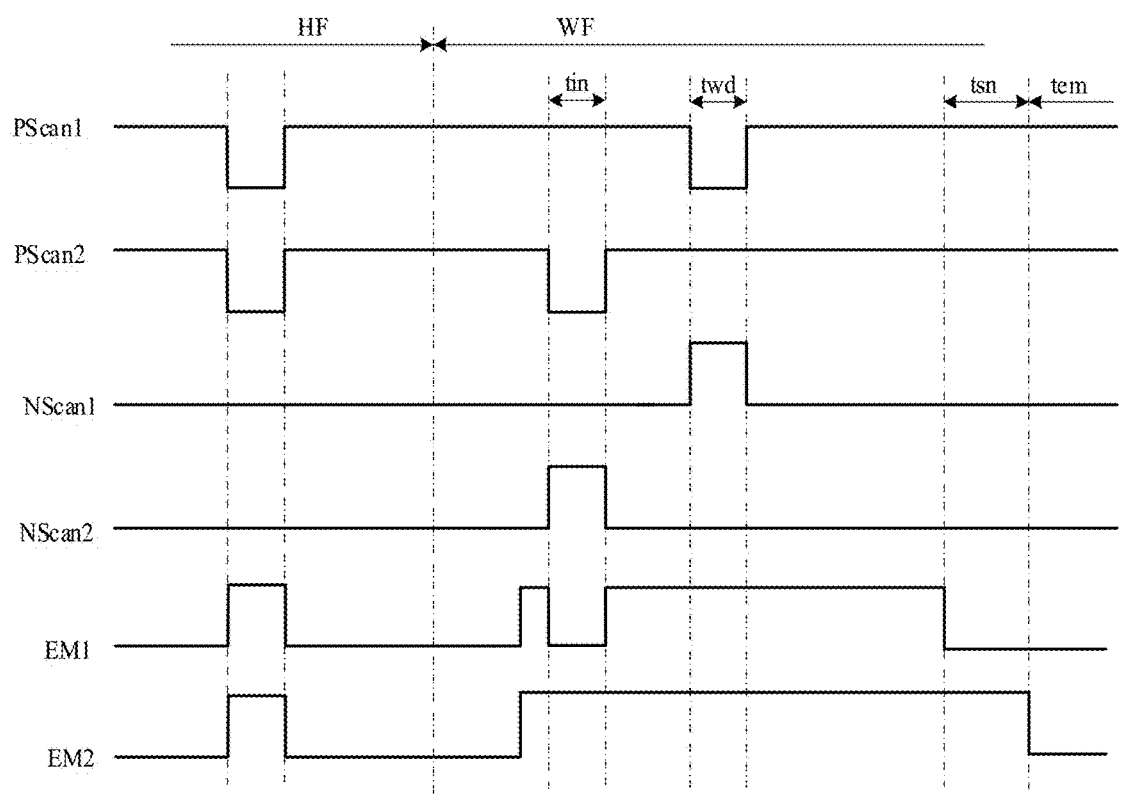

Alternatively, further with reference to FIGS. 1 and 2C, in a display panel to which a pixel drive circuit is applied, a variable refresh frequency technique may be used for display. That is, the same picture content may be displayed in multiple consecutive display frames, and data signals are written only in the first frame (i.e., the write frame) from which the display of the picture starts, and in the remaining frames (i.e., the hold frames), the same picture as that in the write frame is displayed. Therefore, in order to ensure that the same picture as that in the write frame is displayed in the hold frame, the gate potential of the drive transistor Tdr is not reset in the stage corresponding to each hold frame, so as to avoid data signal loss and cause display abnormality. In the corresponding write frame stage, the gate potential of the drive transistor Tdr is reset to remove the remaining data of the previous picture. Therefore, when different display pictures are switched, the reset effect of the gate potential of the drive transistor Tdr in the hold frame for displaying the previous picture is different from that of the write frame for displaying the next picture (the next picture may be different from the previous picture), thereby causing a display brightness difference and causing a flicker problem.

In the present disclosure, a reset stage tin before the data write stage twd is further included in the write frame including the data write stage twd, so that, in the reset stage tin, the first reset transistor Ti1 is configured to transmit the first reset signal to the first node N1, and the first light-emitting control transistor Ts1 is configured to transmit the first voltage signal to the second node N2 and the third node N3. Thus the gate-source voltage Vgs of the drive transistor Tdr is same as the absolute value of the voltage difference between the first reset signal and the first voltage signal. The gate-source voltage Vgs of the drive transistor Tdr is same as the gate-drain voltage Vgd, and the gate-drain voltage Vgd and the gate-source voltage Vgs of the drive transistor Tdr are increased (i.e., the reset effect of the drive transistor Tdr is increased). Therefore, the turn-on degree of the drive transistor Tdr is increased, and accordingly, the driving current is correspondingly increased, so that the brightness in the write frame for displaying a next picture may be increased. The brightness difference between the hold frame for displaying the previous picture and the write frame for displaying the next picture is reduced, and the flicker problem caused by the lower brightness of the write frame for displaying the next picture may be improved.

Alternatively, with reference to FIGS. 1 and 2C, the operation principle of the pixel drive circuit will be described. HF represents a hold frame for displaying a previous picture, and WF represents a write frame for displaying a next picture. It will be appreciated that, a hold frame for displaying the next picture may be displayed after a write frame for displaying the next picture.

In the reset stage tin, the first scan signal PScan1, the third scan signal NScan2, and the second light-emitting control signal EM2 all have high levels, and the first light-emitting control signal EM1 and the second scan signal NScan1 both have low levels. The first reset transistor Ti1 and the first light-emitting control transistor Ts1 are turned on, the first reset signal is transmitted to the first node N1 so that the drive transistor Tdr is turned on, and the first voltage signal is transmitted to the second node N2 and the third node N3. Therefore, the gate-source voltage Vgs and the gate-drain voltage Vgd of the drive transistor Tdr are same as the absolute value (i.e., Vgs=Vgd=|VI1−Vdd|) of the voltage difference between the first reset signal and the first voltage signal. Where VI1 represents the first reset signal and Vdd represents the first voltage signal.

Herein, the operation principle of the pixel drive circuit corresponding to the data write stage twd, the node setting stage tsn, and the light-emitting stage tem in FIG. 2C may be obtained with reference to the operation principle of the pixel drive circuit corresponding to the data write stage twd, the node setting stage tsn, and the light-emitting stage tem in FIG. 2A, and details are not described herein.

Alternatively, the fourth scan signal PScan2 may have a low level at the reset stage tin and/or the data write stage twd, so that the second reset transistor Ti2 is turned on, the second reset signal is transmitted to an anode of the light-emitting device D, and an anode potential of the light-emitting device D is reset.

Alternatively, in the hold frame, the first scan signal PScan1 and the fourth scan signal PScan2 may be at a low-level state in a stage during which the first light-emitting control signal EM1 and the second light-emitting control signal EM2 have high levels, so that the second node N2 and the anode of the light-emitting device D are set through the data line DL and the second reset line VL2, thereby ensuring the light-emitting quality and the light-emitting efficiency of the light-emitting device D.

Figure 2D:
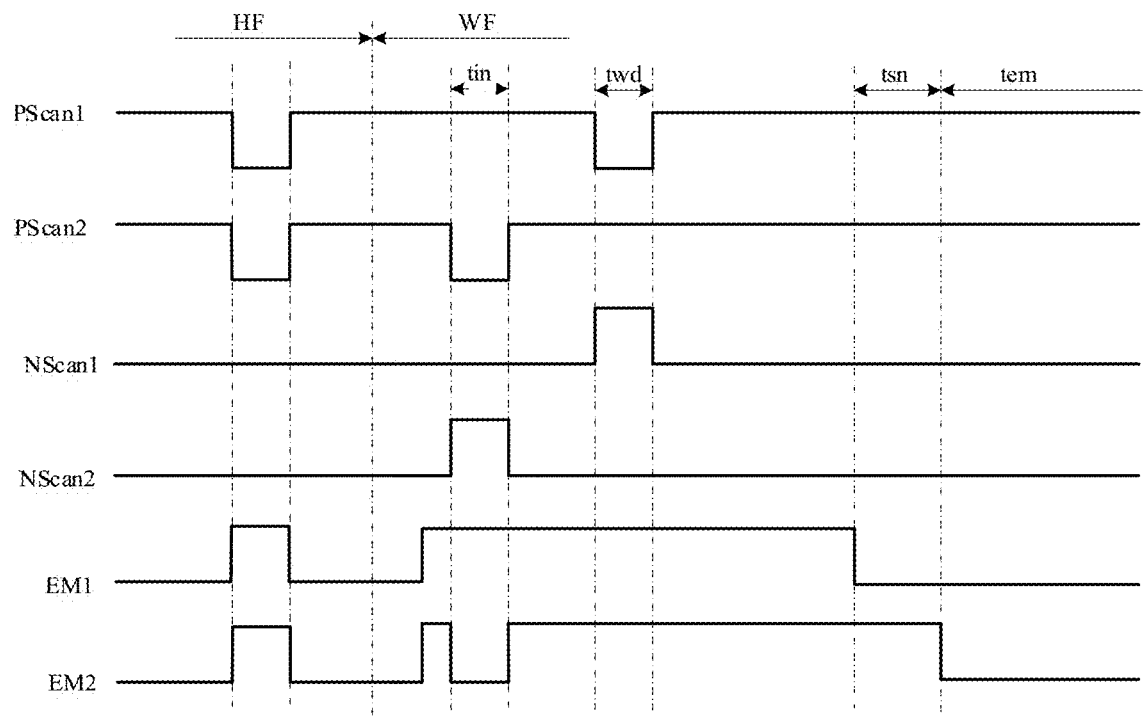

Alternatively, referring to FIG. 1 and FIG. 2D, to improve the flicker problem caused by the greater brightness of the write frame for displaying the next picture, in the present disclosure, a reset stage tin before the data write stage twd is further included in the write frame including the data write stage twd, so that, in the reset stage tin, the first reset transistor Ti1 is configured to transmit the first reset signal to the first node N1, and the second reset transistor Ti2 and the second light-emitting control transistor Ts2 is configured to transmit the second reset signal to the second node N3 and the third node N2. Thus the gate-source voltage Vgs of the drive transistor Tdr is same as the absolute value of the voltage difference between the first reset signal and the second reset signal. The gate-source voltage Vgs of the drive transistor Tdr is same as the gate-drain voltage Vgd, and the gate-drain voltage Vgd and the gate-source voltage Vgs of the drive transistor Tdr are reduced (i.e., the reset effect of the drive transistor Tdr is reduced). Therefore, the turn-on degree of the drive transistor Tdr is reduced, and accordingly, the driving current is correspondingly reduced, so that the brightness in the write frame for displaying a next picture may be reduced. The brightness difference between the hold frame for displaying the previous picture and the write frame for displaying the next picture is reduced, and the flicker problem caused by the greater brightness in the write frame for displaying the next picture may be improved.

Alternatively, with reference to FIGS. 1 and 2D, the operation principle of the pixel drive circuit will be described.

In the reset stage tin, the first scan signal PScan1, the third scan signal NScan2, and the first light-emitting control signal EM1 all have high levels, and the second light-emitting control signal EM2, the second scan signal NScan1, and the fourth scan signal PScan2 all have low levels. The first reset transistor Ti1, the second reset transistor Ti2, and the second light-emitting control transistor Ts2 are turned on, the first reset signal is transmitted to the first node N1, so that the drive transistor Tdr is turned on, the second reset transistor Ti2 and the second light-emitting control transistor Ts2 are turned on, and the second reset signal is transmitted to the second node N2 and the third node N3. Therefore, the gate-source voltage Vgs and the gate-drain voltage Vgd of the drive transistor Tdr is same as the absolute value (i.e., Vgs=Vgd=|VI1-VI2|) of the voltage difference between the first reset signal and the second reset signal. Where VI2 represents the second reset signal.

Herein, the operation principle of the pixel drive circuit corresponding to the data write stage twd, the node setting stage tsn, and the light-emitting stage tem in FIG. 2D may be obtained with reference to the operation principle of the pixel drive circuit corresponding to the data write stage twd, the node setting stage tsn, and the light-emitting stage tem in FIG. 2A, and details are not described herein.

Figure 2E:
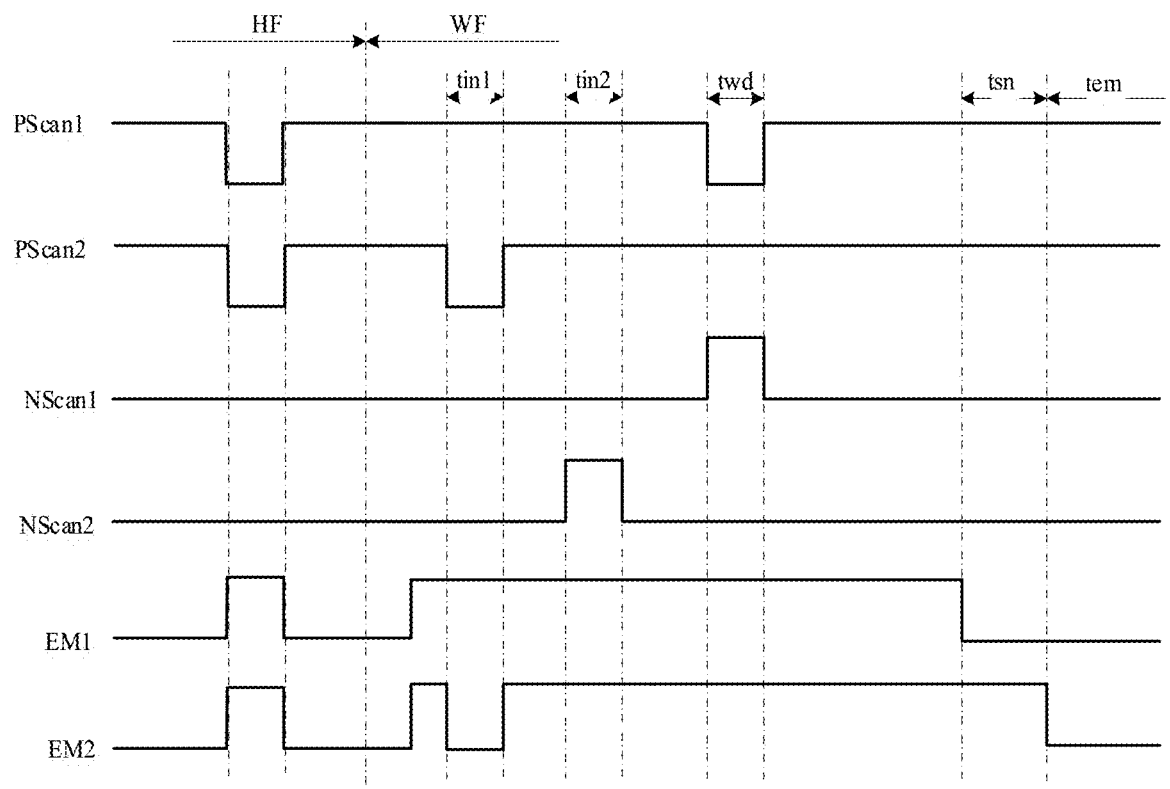

Alternatively, with reference to FIGS. 1 and 2E, a flicker problem due to a display brightness difference caused by the reset effects of the gate potential of the drive transistor Tdr in the hold frame for displaying the previous picture different from that of the write frame for displaying the next picture. In the present disclosure, a first reset stage tin1 before the data write stage twd and a second reset stage tin2 after the first reset stage tin1 and before the data write stage twd are is further included in the write frame including the data write stage twd, so that, in the reset stage tin, the second reset transistor Ti2 and the second light-emitting control transistor Ts2 are configured to transmit the second reset signal to the third node N3 and the second node N2, and in the second reset stage tin2, the first reset transistor Ti1 is configured to transmit the first reset signal to the first node N1. Thus the gate-source voltage Vgs of the drive transistor Tdr is same as the absolute value of the voltage difference between the first reset signal and the first reset signal in the second reset stage tin2. The gate-source voltage Vgs of the drive transistor Tdr is same as the gate-drain voltage Vgd, to improve the reset effect of the drive transistor Tdr. Therefore, the flicker problem caused by the brightness difference between the hold frame for displaying the previous picture and the writing frame for displaying the next picture.

Further, with reference to FIGS. 1 and 2E, the operation principle of the pixel drive circuit will be described.

In the first reset stage tin1, the first scan signal PScan1 and the first light-emitting control signal EM1 both have high levels, and the second scan signal NScan1, the third scan signal NScan2, the fourth scan signal PScan2 and the first light-emitting control signal EM1 all have low levels. The second reset transistor Ti2 and the second light-emitting control transistor Ts2 are turned on, the drive transistor Tdr is turned on, and the second reset signal is transmitted to the second node N2 and the third node N3.

In the second reset stage tin2, the first scan signal PScan1, the fourth scan signal PScan2, the third scan signal NScan2, the first light-emitting control signal EM1, and the second light-emitting control signal EM2 all have high levels, and the second scan signal NScan1 has a low level. The first reset transistor Ti1 is turned on, and the first reset signal is transmitted to the first node N1, so that the gate-source voltage Vgs and the gate-drain voltage Vgd of the drive transistor Tdr have unchanged values (i.e., Vgs=Vgd=VI1-VI2).

Herein, the operation principle of the pixel drive circuit corresponding to the data write stage twd, the node setting stage tsn, and the light-emitting stage tem in FIG. 2E may be obtained with reference to the operation principle of the pixel drive circuit corresponding to the data write stage twd, the node setting stage tsn, and the light-emitting stage tem in FIG. 2A, and details are not described herein.

The present disclosure further provides a display panel including the pixel drive circuit as described above.

Figure 3:
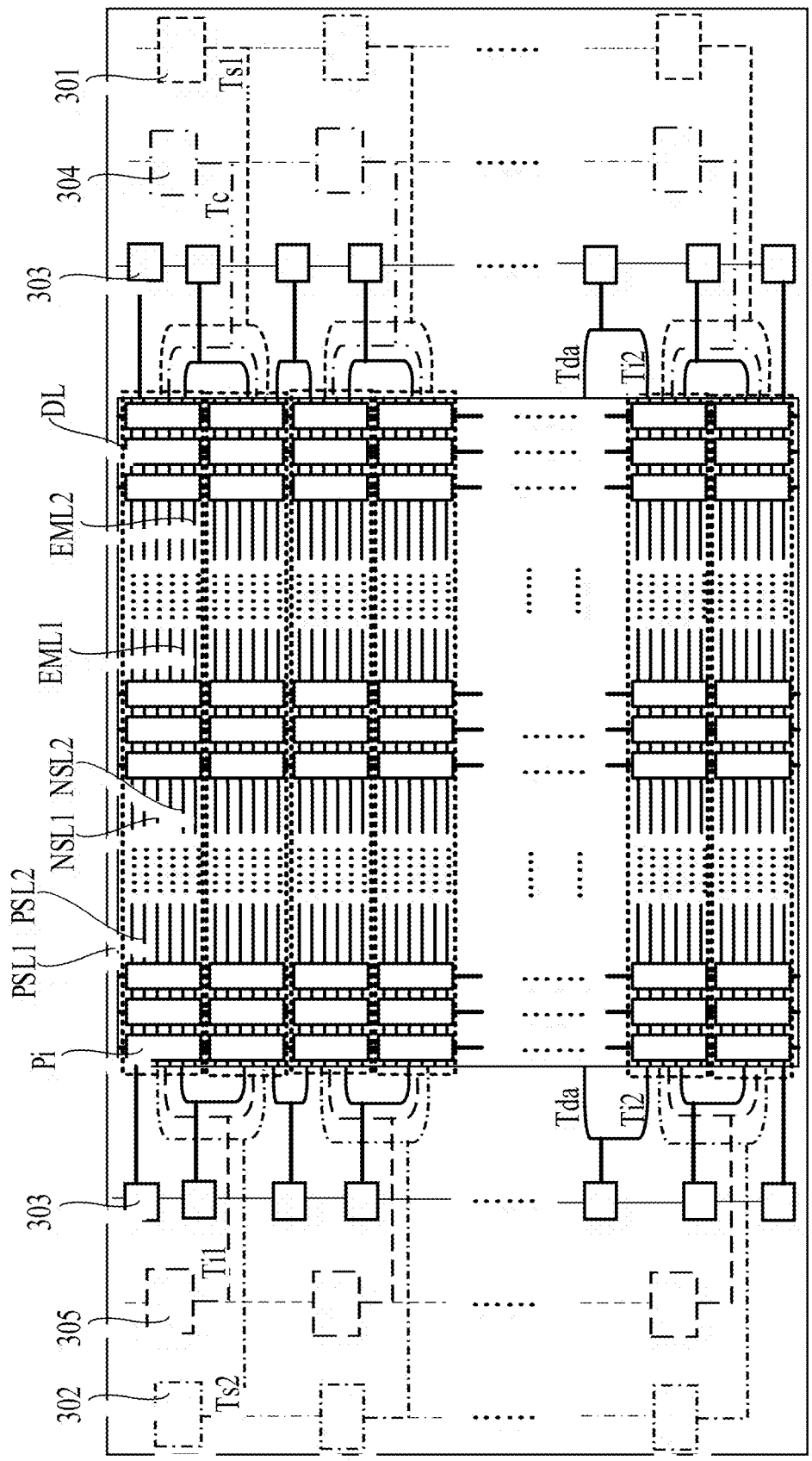
FIG. 3 is a schematic block view of a display panel according to an embodiment of the present disclosure.

FIG. 3 is a schematic plan view of a display panel according to an embodiment of the present disclosure. The present disclosure further provides a display panel including the plurality of sub-pixels Pi, the plurality of first light-emitting control lines EML1, and the plurality of second light-emitting control lines EML2.

Each sub-pixel Pi includes the pixel drive circuit as described above, the plurality of first light-emitting control lines EML1 configured to transmit the plurality of first light-emitting control signals EM1, and the plurality of second light-emitting control lines EML2 configured to transmit the plurality of second light-emitting control signals EM2.

Alternatively, the display panel further includes a plurality of first gate drive circuits 301 connected in cascade with each other and a plurality of second gate drive circuits 302 connected in cascade with each other. The plurality of cascaded first gate driving circuits 301 are configured to output a plurality of first light-emitting control signals EM1, and the plurality of second gate driving circuits 302 connected in cascade with each other are configured to output the plurality of second light-emitting control signals EM2. The first light-emitting control transistors Ts1 of the plurality of pixel drive circuits located in the same row are electrically connected to the first gate drive circuit 301, and the second light-emitting control transistors Ts2 of the plurality of pixel drive circuits located in the same row are electrically connected to the second gate drive circuit 302.

Alternatively, each first gate drive circuit 301 is electrically connected to the first light-emitting control transistors Ts1 of the plurality of pixel drive circuits in two adjacent rows, and each second gate drive circuit 302 is electrically connected to the second light-emitting control transistors Ts2 of the plurality of pixel drive circuits in two adjacent rows.

Alternatively, each first gate drive circuit 301 is electrically connected to the first light-emitting control transistors Ts1 of the plurality of pixel drive circuits in a same row, and each second gate drive circuit 302 is electrically connected to the second light-emitting control transistors Ts2 of the plurality of pixel drive circuits in a same row.

Alternatively, the plurality of first gate drive circuits 301 connected in cascade with each other and the plurality of second gate drive circuits 302 connected in cascade with each other may be provided at opposite sides of the display area of the display panel.

Alternatively, the display panel further includes a plurality of third gate drive circuits 303 connected in cascade with each other. The plurality of third gate drive circuits 303 are configured to output a plurality of first scan signals PScan1. The data transistors Tda of the plurality of pixel drive circuits located in the same row are electrically connected to one of the third gate drive circuits 303. Each third gate drive circuit 303 is electrically connected to the data transistors Tda of the plurality of pixel drive circuits in a same row.

Alternatively, the plurality of third gate drive circuits 303 connected in cascade with each other are configured to output a plurality of fourth scan signals PScan2. The second reset transistors Ti2 of the plurality of pixel drive circuits located in the same row are electrically connected to one of the third gate drive circuits 303. Each third gate drive circuit 303 is electrically connected to the second reset transistors Ti2 of the plurality of pixel drive circuits in a same row. That is, both the first scan signal PScan1 and the fourth scan signal PScan2 may be provided by the third gate drive circuits 303 connected in cascade with each other.

Alternatively, the display panel further includes a plurality of fourth gate drive circuits 304 connected in cascade with each other. The plurality of fourth gate drive circuits 304 are configured to output a plurality of second scan signals NScan1. The compensation transistors Tc of the plurality of pixel drive circuits located in the same row are electrically connected to one of the fourth gate drive circuits 304. Each of the fourth gate drive circuits 304 is electrically connected to the compensation transistors Tc of the plurality of pixel drive circuits in two adjacent rows.

Alternatively, the plurality of fourth gate drive circuits 304 connected in cascade with each other are configured to output a plurality of third scan signals NScan2. The first reset transistors Ti1 of the plurality of pixel drive circuits located in the same row are electrically connected to one of the fourth gate drive circuits 304. Each fourth gate drive circuit 304 is electrically connected to the first reset transistors Ti1 of the plurality of pixel drive circuits in two adjacent rows. That is, both the second scan signal NScan1 and the third scan signal NScan2 may be provided by the fourth gate drive circuits connected in cascade with each other.

Alternatively, the display panel further includes a plurality of fifth gate drive circuits 305 connected in cascade with each other. The plurality of fifth gate drive circuits 305 are configured to output a plurality of third scan signals NScan2. The first reset transistors Ti1 of the plurality of pixel drive circuits located in the same row are electrically connected to one of the fifth gate drive circuits 305, such that the second scan signals NScan1 and the third scan signals NScan2 are provided by different cascaded gate drive circuits.

Alternatively, the display panel further includes a plurality of sixth gate drive circuits connected in cascade with each other. The plurality of sixth gate drive circuits are configured to output the plurality of fourth scan signals PScan2. The second reset transistors Ti2 of the plurality of pixel drive circuits located in the same row are electrically connected to one of the sixth gate drive circuits, such that the first scan signals PScan1 and the fourth scan signals PScan2 are provided by different cascaded gate drive circuits.

Alternatively, the display panel further includes a plurality of first scan lines PSL1 electrically connected to the corresponding gate drive circuits to transmit the first scan signal PScan1, a plurality of second scan lines NSL1 electrically connected to the corresponding gate drive circuits to transmit the second scan signal NScan1, a plurality of third scan lines NSL2 electrically connected to the corresponding gate drive circuits to transmit the third scan signal NScan2, and a plurality of fourth scan lines PSL2 electrically connected to the corresponding gate drive circuits to transmit the fourth scan signal PScan2.

Figure 4A:
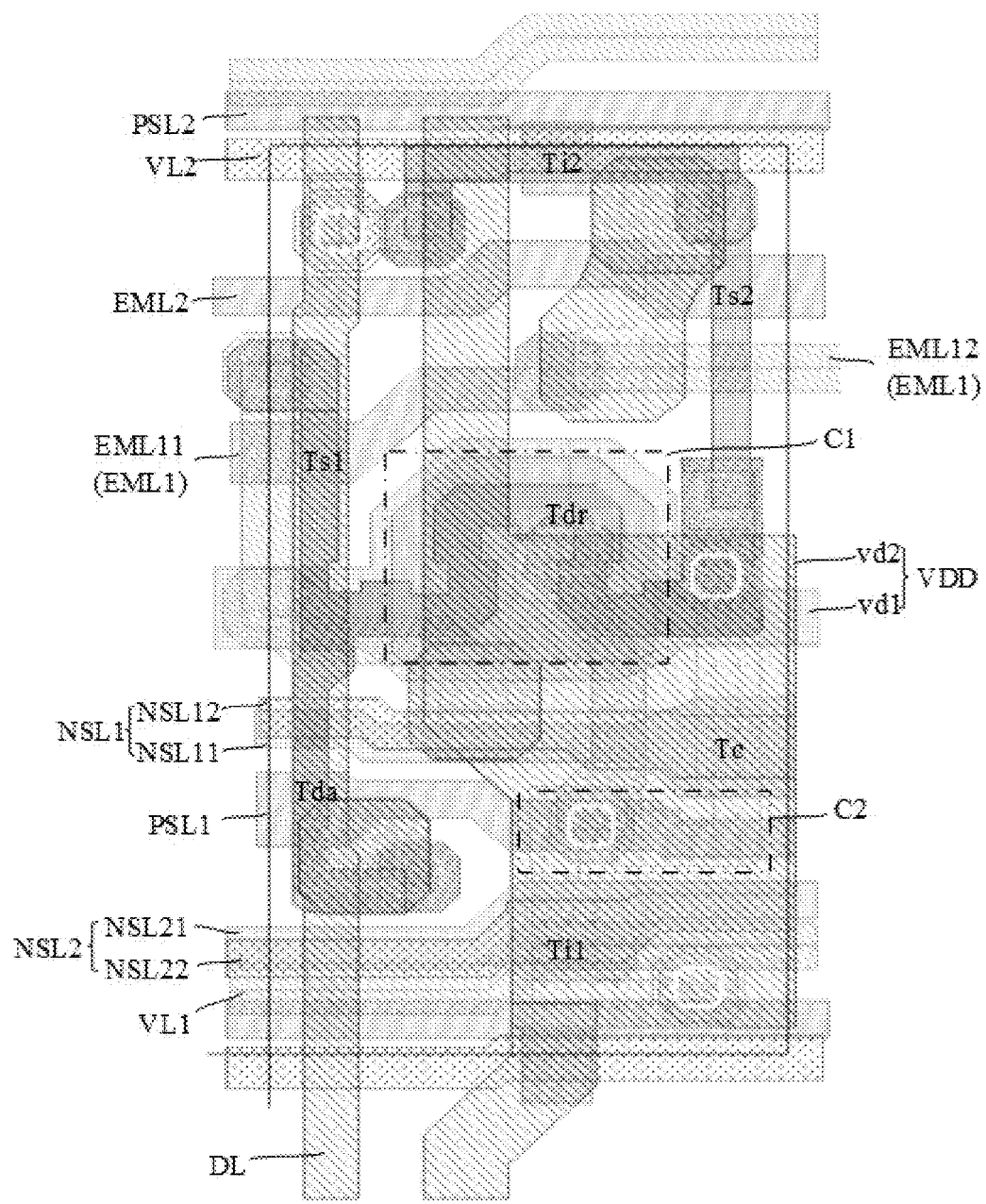
FIGS. 4A-4B are schematic diagram of a film structure of a pixel drive circuit according to an embodiment of the present disclosure.
Figure 4B:
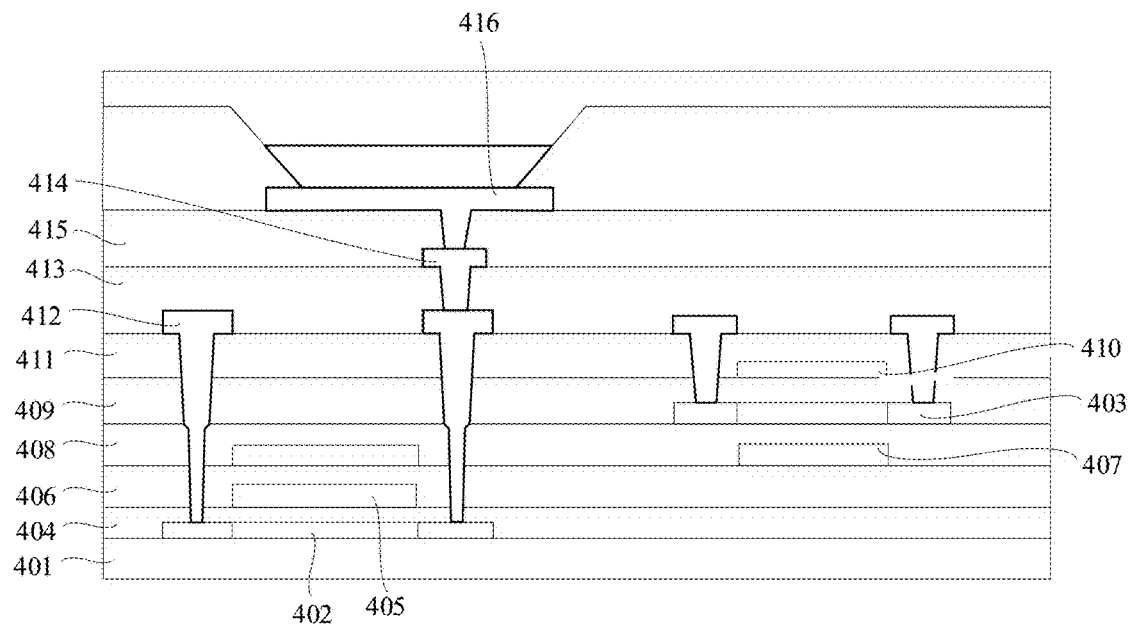

FIGS. 4A-4B are schematic diagrams of a film structure of a pixel drive circuit according to an embodiment of the present disclosure. The display panel may include a substrate 401 and an active layer 402 on the substrate 401.

Alternatively, the substrate 401 includes a flexible substrate and a rigid substrate. Alternatively, the substrate 401 includes polyimide, glass, or the like.

Figure 5A:
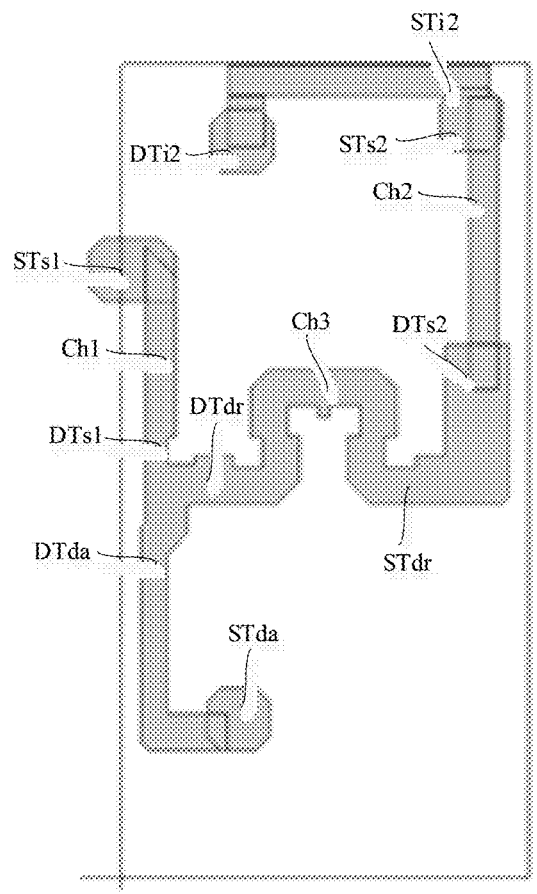
FIG. 5A-5B are schematic plan views of an active layer according to an embodiment of the present disclosure.
Figure 5B:
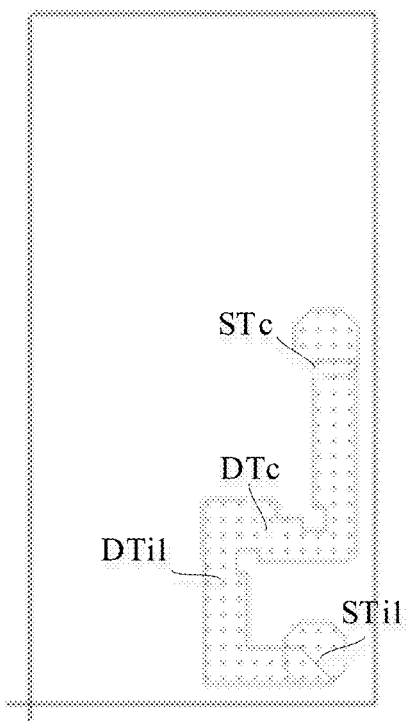

FIGS. 5A-5B are schematic plan view of an active layer according to embodiments of the present disclosure. Alternatively, the active layer 402 includes a silicon semiconductor, an oxide semiconductor, or the like.

The first light-emitting control transistor Ts1 of each pixel drive circuit includes a first active layer including a first channel portion Ch1. The second light-emitting control transistor Ts2 of each pixel drive circuit includes a second active layer including a second channel portion Ch2. The drive transistor Tdr of each pixel drive circuit includes a third active layer including a third channel portion. The data transistor Tda of each pixel drive circuit includes a fourth active layer including a fourth channel portion. A compensation transistor Tc of each pixel drive circuit includes a fifth active layer including a fifth channel portion. The first reset transistor Ti1 of each pixel drive circuit includes a sixth active layer including a sixth channel portion. The second reset transistor Ti2 of each pixel drive circuit includes a seventh active layer including a seventh channel portion. The active layer 402 includes the first active layer, the second active layer, the third active layer, the fourth active layer, and the seventh active layer.

Alternatively, the display panel further includes an oxide active layer 403 located at one side of the active layer 402. The oxide active layer 403 includes the fifth active layer and the sixth active layer.

Alternatively, further with reference to FIG. 4A and FIG. 5A-5B, the seventh active layer of each pixel drive circuit is located at a side of the second active layer away from the third active layer, the fourth active layer and the fifth active layer are located at a side of the third active layer away from the second active layer, and the sixth active layer is located on a side of the fifth active layer away from the third active layer.

Alternatively, a first electrode portion DTs1 of the first active layer and a first electrode portion DTda of the fourth active layer are both electrically connected to a first electrode portion DTdr of the third active layer. A second electrode portion STdr of the third active layer is electrically connected to a first electrode portion DTs2 of the second active layer and a second electrode portion STc of the fifth active layer. A second electrode portion STs2 of the second active layer is electrically connected to a second electrode portion STi2 of the seventh active layer. A first electrode portion DTc of the fifth active layer is electrically connected to a first electrode portion DTi1 of the sixth active layer.

Alternatively, each first light-emitting control line EML1 is located between the third active layers of the plurality of sub-pixels Pi in the same row and a second light-emitting control line EML2. The first active layer and the second active layer of each pixel drive circuit are located at a same side of the third active layer. The first channel portion Ch1 at least partially overlaps the corresponding first light-emitting control line EML1 to form a gate of the first light-emitting control transistor Ts1. The second channel portion Ch2 at least partially overlaps the corresponding second light-emitting control line EML2 to form a gate of the second light-emitting control transistor Ts2.

Alternatively, each first light-emitting control line EML1 includes a plurality of first wiring portions EML11 and a plurality of second wiring portions EML12 electrically connected with each other. Each first wiring portion EML11 at least partially overlaps a corresponding first channel portion Ch1. Each second wiring portion EML12 at least partially overlaps a corresponding second active layer. In a thickness direction of the display panel, a distance between the plurality of first wiring portions EML11 and the corresponding first channel portion Ch1 is less than a distance between the plurality of second wiring portions EML12 and the corresponding second active layer, so as to prevent an overlapping portion of the second wiring portions EML12 and the second active layer from forming a gate, thereby affecting the normal operation of the second light-emitting control transistor Ts2.

Alternatively, the first wiring portion EML11 and the second light-emitting control line EML2 are at the same layer, and the first wiring portion EML11 and the second wiring portion EML12 are at different layers.

Alternatively, the second electrode portion STs1 of the first active layer is located between the first wiring portion EML11 and the second light-emitting control line EML2, and the seventh active layer is located at a side of the second light-emitting control line EML2 away from the first light-emitting control line EML1.

Figure 6:
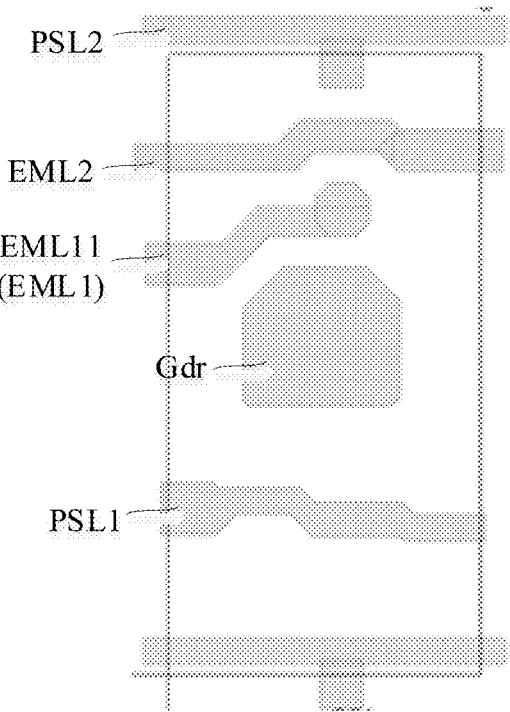
FIG. 6 is a schematic plan view of a first metal layer according to an embodiment of the present disclosure.

FIG. 6 is a schematic plan view of a first metal layer according to an embodiment of The present disclosure. Alternatively, further with reference to FIGS. 4B and 6, the display panel further includes a first metal layer 405 and a first gate insulation layer 404 between the first metal layer 405 and the active layer. The first metal layer 405 includes a second light-emitting control line EML2 and a first wiring portion EML11.

Alternatively, the first metal layer 405 further includes a first scan line PSL1, a fourth scan line PSL2, and a gate portion Gdr that overlaps the third channel portion. The first scan line PSL1 is located at a side of the gate portion Gdr away from the first light-emitting control line EML1 and at least partially overlaps the fourth active layer and the fifth active layer. The fourth scan line PSL2 is located at one side of the second light-emitting control line EML2 away from the first wiring portion EML11 and at least partially overlaps with the seventh active layer.

Alternatively, the first scan line PSL1 at least partially overlaps the oxide active layer 403 to form two electrode plates of the second capacitor C2, respectively.

Figure 7:
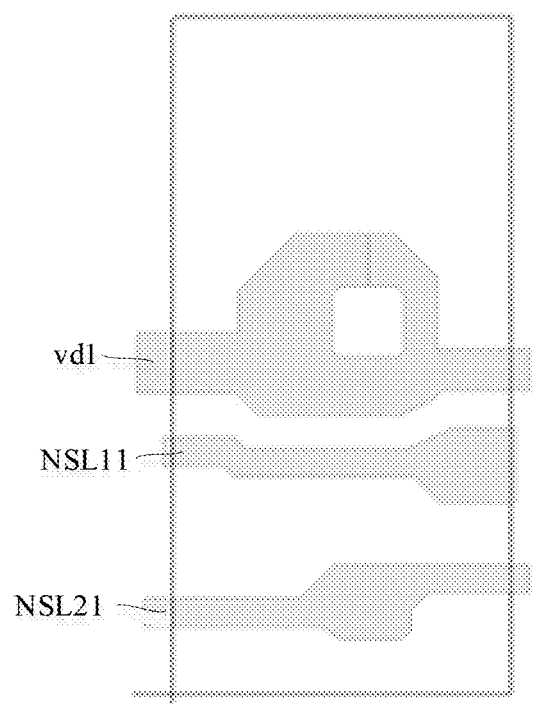
FIG. 7 is a schematic plan view of a second metal layer according to an embodiment of the present disclosure.

FIG. 7 is a schematic plan view of second metal layer according to an embodiment of the present disclosure. Alternatively, further with reference to FIGS. 4A-4B and 7, the display panel further includes a second metal layer 407 and a second gate insulation layer 406 disposed between the first metal layer 405 and the second metal layer 407.

Alternatively, the second metal layer 407 includes a first sub-line NSL21 of the third scan line NSL2, a first sub-line NSL11 of the second scan line NSL1, and a first power supply sub-line vd1 electrically connected to the first power supply terminal VDD. The first sub-line NSL11 of the second scan line NSL1 is located between the first scan line PSL1 and the first power sub-line vd1 and at least partially overlaps with the fifth active layer. The first sub-line NSL21 of the third scan line NSL2 is located at a side of the first scan line PSL1 away from the first sub-line NSL11 of the second scan line NSL1 and at least partially overlaps with the sixth active layer, and the first power supply sub-line vd1 and the gate portion Gdr at least partially overlap to form two electrode plates of the first capacitor C1.

Alternatively, as shown in FIG. 4B, the display panel further includes an interlayer dielectric layer 408 between the oxide active layer 403 and the second metal layer 407 and a first protection layer 409 on the oxide active layer.

Figure 8:
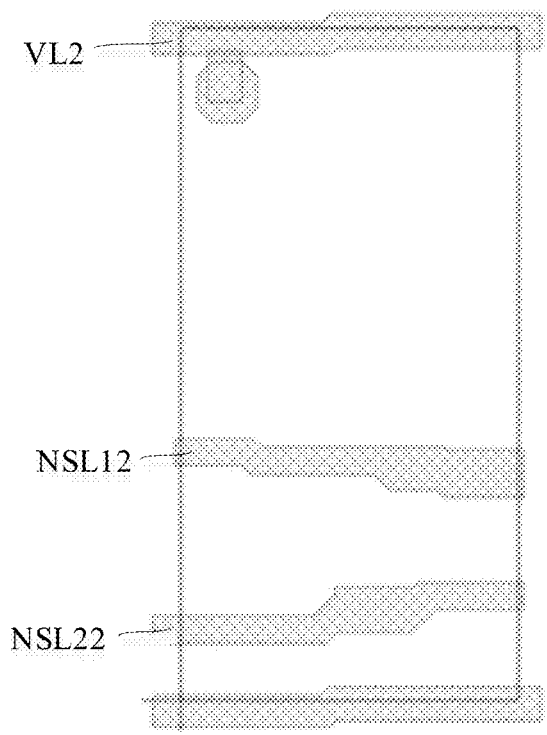
FIG. 8 is a schematic plan view of a third metal layer according to an embodiment of the present disclosure.

FIG. 8 is a schematic plan view of a third metal layer according to an embodiment of the present disclosure. Alternatively, further with reference to FIGS. 4A-4B and 8, the display panel further includes a third metal layer 410 on the first protection layer 409 and a second protection layer 411 on the third metal layer 410.

Alternatively, the third metal layer 410 includes a second sub-line NSL22 of the third scan line NSL2, a second sub-line NSL12 of the second scan line NSL1, and a second reset line VL2. The second sub-line NSL12 of the second scan line NSL1 at least partially overlaps the first sub-line NSL11 of the second scan line NSL1. The second sub-line NSL22 of the third scan line NSL2 at least partially overlaps the first sub-line NSL21 of the third scan line NSL2, and the second reset line VL2 is located between the fourth scan line PSL2 and the second light-emitting control line EML2.

Figure 9:
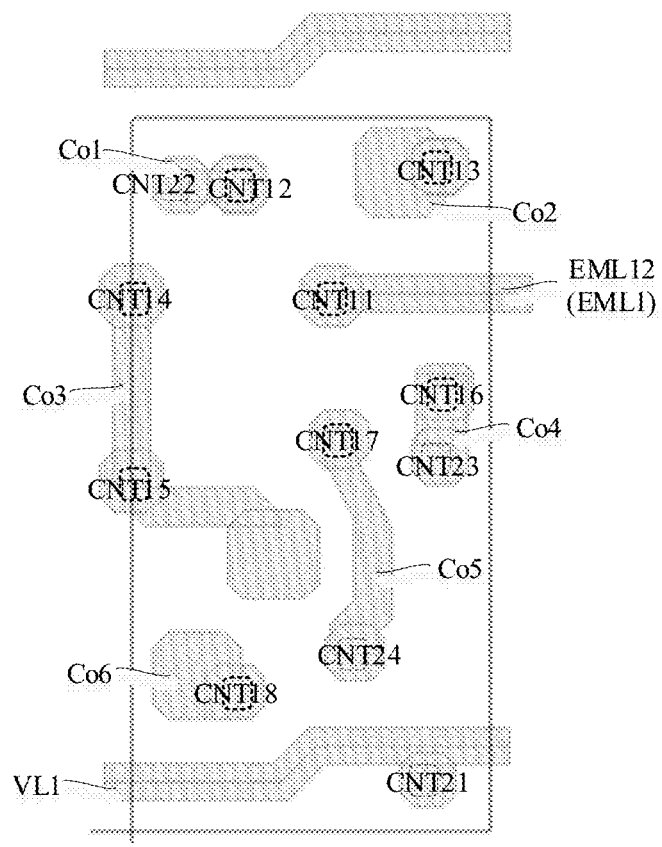
FIG. 9 is a schematic plan view of a fourth metal layer according to an embodiment of the present disclosure.

FIG. 9 is a schematic plan view of a fourth metal layer according to an embodiment of the present disclosure. Alternatively, further with reference to FIGS. 4A-4B and 9, the display panel further includes a fourth metal layer 412 on the second protection layer 411 and a first planarization layer 413 on the fourth metal layer 412.

Alternatively, the fourth metal layer 412 includes a first reset line VL1 located on a side of the third scan line NSL2 away from the first scan line PSL1, and the first reset line VL1 is electrically connected to the second electrode portion STi1 of the sixth active layer through a via hole (CNT21 in FIG. 9) passing through the first protection layer 409 and the second protection layer 411, so that the first reset line VL1 is electrically connected to the first reset transistor Ti1.

Alternatively, the fourth metal layer 412 further includes a second wiring portion EML12 of the first light-emitting control line EML1. The second wiring portion EML12 is electrically connected to the first wiring portion EML11 of the first light-emitting control line EML1 through a via hole (CNT11 in FIG. 9) passing through the second gate insulation layer 406, the interlayer dielectric layer 408, the first protection layer 409, and the second protection layer 411.

Alternatively, the fourth metal layer 412 further includes a first connection portion Co1, a second connection portion Co2, a third connection portion Co3, a fourth connection portion Co4, a fifth connection portion Co5, and a sixth connection portion Co6.

The first connection portion Co1 is electrically connected to the second reset line VL2 through a via hole (CNT22 in FIG. 9) passing through the second protection layer 411, and is electrically connected to the first electrode portion DTi2 of the second reset transistor Ti2 through a via hole (CNT12 in FIG. 9) passing through the first gate insulation layer 404, the second gate insulation layer 406, the interlayer dielectric layer 408, the first protection layer 409, and the second protection layer 411, so that the second reset line VL2 and the second reset transistor Ti2 is electrical connected through the first connection portion Co1.

The second connection portion Co2 is electrically connected to the second electrode portion STi2 of the second reset transistor Ti2 and the second electrode portion STs2 of the second light-emitting control transistor Ts2 by a via hole (CNT13 in FIG. 9) passing through the first gate insulation layer 404, the second gate insulation layer 406, the interlayer dielectric layer 408, the first protection layer 409, and the second protection layer 411.

The third connection portion Co3 is electrically connected to the second electrode portion STs1 of the first light-emitting control transistor Ts1 through a via hole (CNT14 in FIG. 9) passing through the first gate insulation layer 404, the second gate insulation layer 406, the interlayer dielectric layer 408, the first protection layer 409, and the second protection layer 411, and is electrically connected to the first power sub-line vd1 through a via hole (CNT15 in FIG. 9) passing through the interlayer dielectric layer 408, the first protection layer 409, and the second protection layer 411.

The fourth connection portion Co4 is electrically connected to the first electrode portion DTs2 of the second light-emitting control transistor Ts2 through a via hole (CNT16 in FIG. 9) passing through the first gate insulation layer 404, the second gate insulation layer 406, the interlayer dielectric layer 408, the first protection layer 409, and the second protection layer 411, and is electrically connected to the second electrode portion STc of the compensation transistor Tc through a via hole (CNT23 in FIG. 9) passing through the first protection layer 409 and the second protection layer 411, so that the compensation transistor Tc is electrically connected to the second light-emitting control transistor Ts2 through the fourth connection portion Co4, that is, the fourth connection portion Co4 may be used as the third node N3.

The fifth connection portion Co5 is electrically connected to the gate portion Gdr through a via hole (CNT17 in FIG. 9) passing through the second gate insulation layer 406, the interlayer dielectric layer 408, the first protection layer 409, and the second protection layer 411, and is electrically connected to the first electrode portion DTc of the compensation transistor Tc through a via hole (CNT24 in FIG. 9) passing through the first protection layer 409 and the second protection layer 411, so that the gate of the drive transistor Tdr is electrically connected to the compensation transistor Tc through the fifth connection portion Co5.

The sixth connection portion Co6 is electrically connected to the second electrode portion STda of the data transistor Tda through a via (CNT18 in FIG. 9) passing through the first gate insulation layer 404, the second gate insulation layer 406, the interlayer dielectric layer 408, the first protection layer 409, and the second protection layer 411.

Figure 10:
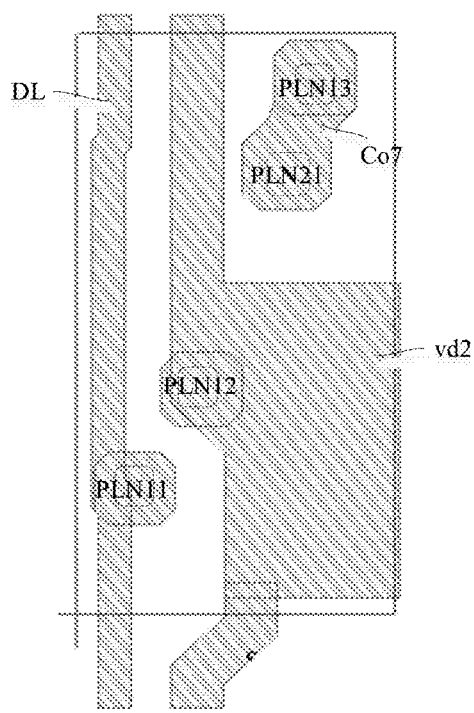
FIG. 10 is a schematic plan view of a fifth metal layer according to an embodiment of the present disclosure.

FIG. 10 is a schematic plan view of a fifth metal layer according to an embodiment of the present disclosure. Alternatively, with continued reference to FIGS. 4A-4B and 10, the display panel further includes a fifth metal layer 414 on the first planarization layer 413 and a second planarization layer 415 on the fifth metal layer 414.

Alternatively, the fifth metal layer 414 includes the data line DL, the second power sub-line vd2 electrically connected to the first power terminal VDD, and the seventh connection portion Co7.

The data line DL is electrically connected to the sixth connection portion Co6 through a via hole (PLN11 in FIG. 10) passing through the first planarization layer 413, so that the data line DL and the data transistor Tda are electrically connected through the sixth connection portion Co6.

The second power supply sub-line vd2 is electrically connected to the third connection portion Co3 through a via hole (PLN12 in FIG. 10) extending through the first planarization layer 413, so that the first light-emitting control transistor Ts1 is electrically connected to the first power supply terminal VDD through the third connection portion Co3, the first power supply sub-line vd1, and the second power supply sub-line vd2.

The seventh connection portion Co7 is electrically connected to the second connection portion Co2 through a via hole (PLN13 in FIG. 10) passing through the first planarization layer 413.

Figure 11:
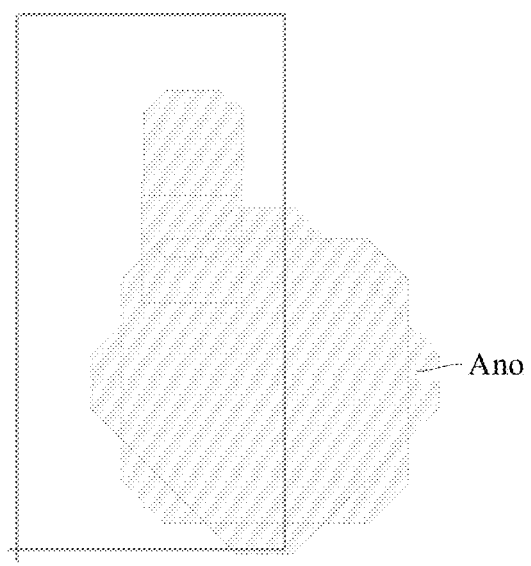
FIG. 11 is a schematic plan view of an anode layer according to an embodiment of the present disclosure.

FIG. 11 is a schematic plan view of an anode layer according to an embodiment of the present disclosure. Further with reference to FIGS. 4A-4B and 11, the display panel further includes an anode layer 416 disposed on the second planarization layer 415. The anode layer 416 includes an anode Ano of the light-emitting device D, and the anode Ano is electrically connected to the seventh connection portion Co7 through a via hole (PLN21 in FIG. 10) passing through the second planarization layer 415, so that the light-emitting device D is electrically connected to the pixel drive circuit through the seventh connection portion Co7.

Alternatively, the first wiring portion EML11 of the first light-emitting control line EML1 has a folded line to avoid the via hole (i.e., CNT14) in which the third connection portion Co3 is electrically connected to the first light-emitting control transistor Ts1, and the portion of the first power supply sub-line vd1 that overlaps the gate portion Gdr, so as to avoid problems such as short circuits.

Alternatively, the first wiring portion EML11 includes a first sub-wiring portion, a second sub-wiring portion, and a third sub-wiring portion. A extension direction of the first sub-wiring portion is same as the third sub-wiring portion. An extension line of the first sub-wiring portion does not coincide with an extension line of the third sub-wiring portion, and the second sub-wiring portion is between and connected with the third sub-wiring portion and the first sub-wiring portion. The first sub-wiring portion at least partially overlaps the corresponding first channel portion, and the third sub-wiring portion is electrically connected to the second wiring portion. Alternatively, the distance of the first sub-wiring portion from the second light-emitting control line EML2 is greater than the distance of the third sub-wiring portion from the second light-emitting control line EML2.

Alternatively, the second light-emitting control line EML2 has folded-line shape to avoid the via hole (i.e., CNT11) electrically connecting the first wiring portion EML11 of the first light-emitting control line EML1 with the second wiring portion EML12, the via hole (i.e., CNT14) electrically connecting the third connection portion Co3 with the first light-emitting control transistor Ts1, and the via hole (i.e., CNT13) electrically connecting the first connection portion Co1, the second connection portion Co2 with the second reset transistor Ti2, and the second light-emitting control transistor Ts2, so as to avoid problems such as short circuits.

Alternatively, the display panel further includes a pixel definition layer, a light-emitting layer, a cathode layer, etc. on the anode layer 416.

The present disclosure provides a display device including any of the above pixel drive circuits or display panels.

The principles and embodiments of the present disclosure are described by using specific examples. The description of the above embodiments is merely provided to help understand the method and the core idea of the present disclosure. At the same time, for those of ordinary skill in the art, changes may be made in both the detailed description and the scope of application in accordance with the teachings of the present disclosure. In view of the foregoing, the present specification should not be construed as limiting the application.

What is claimed is:

1. A pixel drive circuit, comprising:
a light-emitting device between and electrically connected to a first power supply terminal and a second power supply terminal;
a drive transistor having a gate electrically connected to a first node and a source and a drain between and electrically connected to a second node and a third node, wherein the drive transistor is configured to generate a driving current to drive the light-emitting device during a light-emitting stage to emit light in response to a data signal written in a data write stage;

a first light-emitting control transistor having a source and a drain between and electrically connected to the first power supply terminal and the second node, and a gate configured to receive a first light-emitting control signal;

a second light-emitting control transistor having a source and a drain between and electrically connected to the third node and the light-emitting device, and a gate configured to receive a second light-emitting control signal;

a data transistor, wherein one of a source and a drain of the data transistor is directly electrically connected to the second node, the other of the source and the drain of the data transistor is configured to receive the data signal, a gate of the data transistor is configured to receive a first scan signal;

a compensation transistor having a source and a drain between and directly electrically connected to the first node and the third node, and a gate configured to receive a second scan signal;

a first reset transistor, wherein one of a source and a drain of the first reset transistor is electrically connected to the first node, the other of the source and the drain of the first reset transistor is configured to receive a first reset signal, and a gate of the first reset transistor is configured to receive a third scan signal; and a second reset transistor, wherein one of a source and a drain of the second reset transistor is electrically connected to the light-emitting device, the other of the source and the drain of the second reset transistor is configured to receive a second reset signal different from the first reset signal, and a gate of the second reset transistor is configured to receive a fourth scan signal;

wherein the first light-emitting control transistor is configured to transmit a first voltage signal supplied from the first power supply terminal to the second node and the third node at a node setting stage after the data write stage and before the light-emitting stage.

2. The pixel drive circuit according to claim 1, wherein the data transistor and the compensation transistor are configured to transmit the data signal to the first node during the data write stage.

3. The pixel drive circuit according to claim 2, wherein in a first reset stage before the data write stage, the compensation transistor and the first light-emitting control transistor are configured to transmit the first voltage signal to the first node, the second node, and the third node;

wherein the first reset transistor is configured to transmit the first reset signal to the first node in a second reset stage after the first reset stage and before the data write stage.

4. The pixel drive circuit according to claim 2, wherein a write frame corresponding to the data write stage further comprises a reset stage before the data write stage, the first reset transistor is configured to transmit the first reset signal to the first node during the reset stage, and the first light-emitting control transistor is configured to transmit the first voltage signal to the third node and the second node.

5. The pixel drive circuit according to claim 2, wherein a write frame corresponding to the data write stage further comprises a first reset stage before the data write stage and a second reset stage after the first reset stage and before the data write stage;

wherein in the first reset stage, the second reset transistor and the second light-emitting control transistor are configured to transmit the second reset signal to the third node and the second node;

in the second reset stage, the first reset transistor is configured to transmit the first reset signal to the first node.

6. The pixel drive circuit according to claim 2, wherein a write frame corresponding to the data write stage further comprising a reset stage before the data write stage, the first reset transistor is configured to transmit the first reset signal to the first node during the reset stage, the second reset transistor and the second light-emitting control transistor are configured to transmit the second reset signal to the third node and the second node.

7. A display panel, comprising:
a plurality of sub-pixels, wherein each of the sub-pixels comprises a pixel drive circuit comprising: a light-emitting device between and electrically connected to a first power supply terminal and a second power supply terminal; a drive transistor having a gate electrically connected to a first node and a source and a drain between and electrically connected to a second node and a third node, wherein the drive transistor is configured to generate a driving current to drive the light-emitting device during a light-emitting stage to emit light in response to a data signal written in a data write stage; a first light-emitting control transistor having a source and a drain between and electrically connected to the first power supply terminal and the second node, and a gate configured to receive a first light-emitting control signal; and a second light-emitting control transistor having a source and a drain between and electrically connected to the third node and the light-emitting device, and a gate configured to receive a second light-emitting control signal, wherein the first light-emitting control transistor is configured to transmit a first voltage signal supplied from the first power supply terminal to the second node and the third node at a node setting stage after the data write stage and before the light-emitting stage;

a plurality of first light-emitting control lines configured to transmit a plurality of the first light-emitting control signals; and a plurality of second light-emitting control lines configured to transmit a plurality of the second light-emitting control signals;

wherein the first light-emitting control transistor of each of the pixel drive circuits comprises a first active layer comprising a first channel portion, the second light-emitting control transistor of each of the pixel drive circuits comprises a second active layer comprising a second channel portion, the drive transistor of each of the pixel drive circuits comprises a third active layer;

each of the first light-emitting control lines is located between the third active layers of a portion of the plurality of sub-pixels in a same row and the second light-emitting control line; the first active layer and the second active layer of each of the pixel drive circuits are located at a same side of the third active layer, and the first channel portion at least partially overlaps a corresponding one of the first light-emitting control lines, and the second channel portion at least partially overlaps a corresponding one of the second light-emitting control lines.

8. The display panel according to claim 7, wherein
each of the first light-emitting control lines comprises a plurality of first wiring portions and a plurality of second wiring portions electrically connected, each of the first wiring portions at least partially overlaps a corresponding one of the first channel portions, and each of the second wiring portions at least partially overlaps a corresponding one of the second active layers;
wherein in a thickness direction of the display panel, a distance between the plurality of first wiring portions and the corresponding first channel portions is less than a distance between the plurality of second wiring portions and the corresponding second active layer.

9. The display panel according to claim 8, wherein the first wiring portion and the second light-emitting control line are in a same layer, and the first wiring portion and the second wiring portion are in different layers.

10. The display panel according to claim 7, further comprising:
a plurality of cascaded first gate drive circuits configured to output the first light-emitting control signals; and
a plurality of cascaded second gate drive circuits configured to output the second light-emitting control signals;
wherein the first light-emitting control transistors of the plurality of pixel drive circuits located in a same row are electrically connected to one of the first gate drive circuits, and the second light-emitting control transistors of the plurality of pixel drive circuits located in a same row are electrically connected to one of the second gate drive circuits.

11. The display panel according to claim 10, wherein each of the first gate drive circuits is electrically connected to the first light-emitting control transistors of ones of the pixel drive circuits in two adjacent rows, and each of the second gate drive circuits is electrically connected to the second light-emitting control transistors of ones of the pixel drive circuits in two adjacent rows.

12. The display panel according to claim 7, further comprising:
a data transistor, wherein one of a source and a drain of the data transistor is electrically connected to the second node, the other of the source and the drain of the data transistor is configured to receive the data signal, a gate of the data transistor is configured to receive a first scan signal;
a compensation transistor having a source and a drain between and electrically connected to the first node and the third node, and a gate configured to receive a second scan signal;
a first reset transistor, wherein one of a source and a drain of the first reset transistor is electrically connected to the first node, the other of the source and the drain of the first reset transistor is configured to receive a first reset signal, and a gate of the first reset transistor is configured to receive a third scan signal; and
a second reset transistor, wherein one of a source and a drain of the second reset transistor is electrically connected to the light-emitting device, the other of the source and the drain of the second reset transistor is configured to receive a second reset signal, and a gate of the second reset transistor is configured to receive a fourth scan signal;
wherein the data transistor and the compensation transistor are configured to transmit the data signal to the first node during the data write stage.

13. The display panel according to claim 12, wherein
in a first reset stage before the data write stage, the compensation transistor and the first light-emitting control transistor are configured to transmit the first voltage signal to the first node, the second node, and the third node;
wherein the first reset transistor is configured to transmit the first reset signal to the first node in a second reset stage after the first reset stage and before the data write stage.

14. The display panel according to claim 12, wherein a write frame corresponding to the data write stage further comprises a reset stage before the data write stage, the first reset transistor is configured to transmit the first reset signal to the first node during the reset stage, and the first light-emitting control transistor is configured to transmit the first voltage signal to the third node and the second node.

15. The display panel according to claim 12, wherein a write frame corresponding to the data write stage further comprises a first reset stage before the data write stage and a second reset stage after the first reset stage and before the data write stage;
wherein in the first reset stage, the second reset transistor and the second light-emitting control transistor are configured to transmit the second reset signal to the third node and the second node;
in the second reset stage, the first reset transistor is configured to transmit the first reset signal to the first node.

16. The display panel according to claim 12, wherein a write frame corresponding to the data write stage further comprises a reset stage before the data write stage, the first reset transistor is configured to transmit the first reset signal to the first node during the reset stage, the second reset transistor and the second light-emitting control transistor are configured to transmit the second reset signal to the third node and the second node.

* * * * *